US011239064B2

United States Patent
Fujii et al.

(10) Patent No.: US 11,239,064 B2
(45) Date of Patent: Feb. 1, 2022

(54) MAGNET UNIT FOR MAGNETRON SPUTTERING APPARATUS

(71) Applicant: ULVAC, INC., Kanagawa (JP)

(72) Inventors: Yoshinori Fujii, Kanagawa (JP); Shinya Nakamura, Kanagawa (JP)

(73) Assignee: ULVAC, INC., Kanagawa (JP)

( * ) Notice: Subject to any disclaimer, the term of this patent is extended or adjusted under 35 U.S.C. 154(b) by 0 days.

(21) Appl. No.: 16/973,277

(22) PCT Filed: Jul. 23, 2019

(86) PCT No.: PCT/JP2019/028787
§ 371 (c)(1),
(2) Date: Dec. 8, 2020

(87) PCT Pub. No.: WO2020/066247
PCT Pub. Date: Apr. 2, 2020

(65) Prior Publication Data
US 2021/0249241 A1     Aug. 12, 2021

(30) Foreign Application Priority Data

Sep. 27, 2018   (JP) .............................. JP2018-181910

(51) Int. Cl.
*H01J 37/34* (2006.01)
*C23C 14/35* (2006.01)

(52) U.S. Cl.
CPC ........ *H01J 37/3455* (2013.01); *C23C 14/351* (2013.01); *H01J 37/3408* (2013.01); *H01J 37/3452* (2013.01)

(58) Field of Classification Search
CPC ............... H01J 37/3455; H01J 37/3408; H01J 37/3452; C23C 14/351; C23C 14/35
(Continued)

(56) References Cited

U.S. PATENT DOCUMENTS

| 5,182,003 A | 1/1993 | Maass et al. |
| 2007/0193881 A1 | 8/2007 | Inagawa et al. |
| 2010/0213048 A1 | 8/2010 | Endo et al. |

FOREIGN PATENT DOCUMENTS

| EP | 0337012 A2 * 10/1989 .......... H01J 37/3408 |
| JP | 4-268075 A  9/1992 |

(Continued)

OTHER PUBLICATIONS

JP-2016157820-A Translation (Year: 2016).*

(Continued)

*Primary Examiner* — James Lin
*Assistant Examiner* — Patrick S Ott
(74) *Attorney, Agent, or Firm* — Cermak Nakajima & McGowan LLP; Tomoko Nakajima (57) ABSTRACT

A magnet unit for a magnetron sputtering apparatus is disposed above the target has: a yoke made of magnetic material and is disposed to lie opposite to the target; and plural pieces of magnets disposed on a lower surface of the yoke, wherein a leakage magnetic field in which a line passing through a position where the vertical component of the magnetic field becomes zero is closed in an endless manner, is caused to locally act on such a lower space of the target as is positioned between the center of the target and a periphery thereof, the magnet unit being driven for rotation about the center of the target. In a predetermined position of the yoke there is formed a recessed groove in a circumferentially elongated manner along an imaginary circle with the center of the target serving as a center.

4 Claims, 6 Drawing Sheets (58) Field of Classification Search
USPC .......................................... 204/298.2, 298.19
See application file for complete search history.

(56) References Cited

FOREIGN PATENT DOCUMENTS

| | | | |
|---|---|---|---|
| JP | 2009-516776 | A | 4/2009 |
| JP | 2010-222698 | A | 10/2010 |
| JP | 2016-011445 | A | 1/2016 |
| JP | 2016-157820 | A | 9/2016 |
| JP | 2016157820 | A * | 9/2016 |

OTHER PUBLICATIONS

EP-0337012-A2 Translation (Year: 1989).*
International Search Report for PCT Patent App. No PCT/JP2019/028787 (dated Oct. 8, 2019) with English language translation.

* cited by examiner

MAGNET UNIT FOR MAGNETRON SPUTTERING APPARATUS

This application is a national phase entry under 35 U. S.C. § 371 of PCT Patent Application No. PCT/JP2019/028787, filed on Jul. 23, 2019, which claims priority under 35 U.S.C. § 119 to Japanese Patent Application No. 2018-181910, filed on Sep. 27, 2018, both of which are incorporated by reference.

TECHNICAL FIELD

The present invention relates to a magnet unit for a magnetron sputtering apparatus.

BACKGROUND ART

In the process of manufacturing, e.g., semiconductor devices, a magnetron sputtering apparatus is sometimes used in order to form a predetermined thin film on a surface of a substrate to be processed, such as a semiconductor wafer, at a good volume production. As the magnetron sputtering apparatus, the following is generally known. In other words, a magnet unit is disposed above a target, provided that a side of the target that gets sputtered is defined to be a sputtering surface and that the sputtering surface side of the target is defined to be lower. In order to attain an extended lifetime of the target and the like by substantially uniform erosion of the target, the magnet unit has: for example, a yoke made of magnetic material and disposed so as to lie opposite to the target; and a plurality of magnets disposed on a lower surface of the yoke. A leakage magnetic field in which a line passing through a position where the vertical component of the magnetic field becomes zero is closed in an endless manner, is caused to locally act on a lower space of the target, and the lower space is positioned between the center of the target and a periphery thereof. The magnet unit is driven for rotation about the center of the target.

By the way, when the sputtering conditions such as the material of the target, the pressure inside the vacuum chamber, and the like are different, the splashing distribution of the sputtered particles may vary and, as a result, there is a case in which the film thickness distribution in the circumferential direction (hereinafter called "circumferential film thickness distribution") in the outer periphery of the substrate varies. There is known, e.g., in patent document 1 a method of adjusting the variation when the circumferential film thickness distribution varies. According to this prior art, provided that the time in which a region for the magnetic field to locally act on the target moves from an origin on the same orbit back to the origin is defined as one cycle. Then, the orbit of the magnet unit in one cycle is divided into a plurality of zones. At least one zone out of the plurality of zones is defined to be a reference zone that moves at a reference speed. For respective zones other than the reference zone, the rotational speed (the amount of acceleration or the amount of deceleration from the reference speed) is determined depending on the film thickness distribution.

However, in the above-mentioned prior art, when an adjustment is made, e.g., of the circumferential film thickness distribution in the outer periphery of the substrate, the circumferential film thickness distribution in the inner periphery on the inner side than the one in question (particularly, in the region near the center of the substrate) becomes locally deteriorated and, consequently, an in-plane film thickness distribution of the substrate will all the more be deteriorated.

PRIOR ART DOCUMENT

Patent Document

Patent Document 1: JP-A-2016-011445

SUMMARY OF THE INVENTION

Problems that the Invention ISS to Solve

In view of the above points, this invention has a problem in providing a magnet unit for a magnetron apparatus in which, when a predetermined thin film is formed on a substrate, a more uniform film thickness distribution can be obtained over the entire surface of the substrate.

In order to solve the above problems, this invention is a magnet unit for a magnetron sputtering apparatus, the magnet unit being disposed above a target, provided that such a side of the target that gets sputtered is defined to be a sputtering surface and that a sputtering surface side of the target is defined to be lower. The magnet unit comprises: a yoke made of magnetic material and disposed so as to lie opposite to the target; and a plurality of magnets disposed on a lower surface of the yoke, wherein a leakage magnetic field in which a line passing through a position where the vertical component of the magnetic field becomes zero is closed in an endless manner, is caused to locally act on such a lower space of the target as is positioned between a center of the target and a periphery thereof, the magnet unit being driven for rotation about the center of the target. The yoke has: in a predetermined position thereof a recessed groove formed in a circumferentially elongated manner along an imaginary circle in a manner to be recessed from an upper surface of the yoke downward or penetrating the yoke; and an auxiliary yoke disposed in a manner to be freely engaged with, or released out of engagement with, the recessed groove.

According to this invention, when the auxiliary yoke is engaged with the recessed groove formed in the yoke or the auxiliary yoke is released out of engagement with the recessed groove, the magnetic field strength locally increases or decreases in the region in which the recessed groove is formed. Therefore, in case, by adjusting the circumferential film thickness distribution in the outer periphery of the substrate as in the above-mentioned prior art, the film thickness on the inner side in the inner periphery of the substrate becomes locally thinner, the auxiliary yoke may be fitted into engagement with the recessed groove that is formed in the inner periphery of the substrate. Then, the magnetic field strength increases and the sputtering rate in the region in question can be increased. As a result, the film thickness in the area in which the film thickness changed can be adjusted once again so that a more uniform film thickness distribution can be obtained over the entire surface of the substrate. By the way, the position of forming the recessed groove may be appropriately set by taking into consideration the sputtering conditions, the strength of the leakage magnetic field and its distribution.

In this invention, preferably the auxiliary yoke is set shorter than a circumferential length of the recessed groove. The magnet unit further comprises a first drive means for moving the auxiliary yoke along the imaginary circle. According to this arrangement, the auxiliary yoke can be moved to a predetermined portion of the recessed groove so that the auxiliary yoke can be engaged with a predetermined portion of the recessed groove. Further, in this invention, preferably, the magnet unit further comprises a second drive means for moving the auxiliary yoke in a direction toward or away from the recessed groove.

MODES FOR CARRYING OUT THE INVENTION

With reference to the drawings, they are schematic views to explain the construction of a sputtering apparatus to which is applied a magnet unit for magnetron sputtering apparatus relating to an embodiment of this invention. In the following description, the terms denoting the directions such as "up" and "down" shall be understood to be based on FIG. 1.

Figure 1:
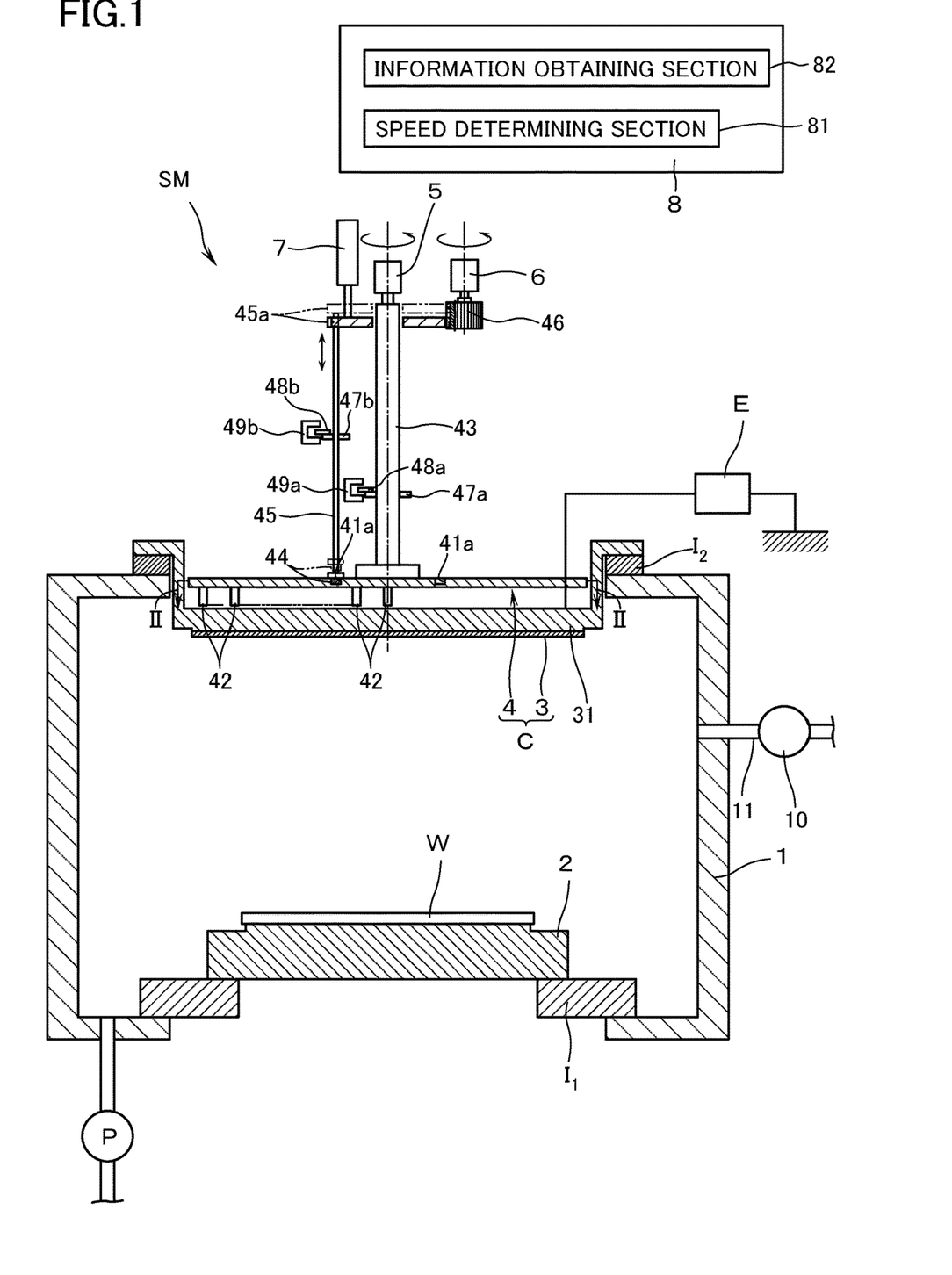
FIG. 1 is a schematic view to explain the construction of a sputtering apparatus to which is applied a magnet unit for magnetron sputtering apparatus relating to an embodiment of this invention.

With reference to FIG. 1, reference mark SM denotes a sputtering apparatus. The sputtering apparatus SM is provided with a vacuum chamber 1 which can be evacuated to a predetermined pressure by a vacuum exhaust means P such as a rotary pump, a turbo molecular pump and the like. To a side wall of the vacuum chamber 1 there is connected a gas pipe 11 having interposed therein a mass flow controller 10 so that a sputtering gas can be introduced from a gas source (not illustrated) into the inside of the vacuum chamber 1 at a predetermined flow rate. As the sputtering gas, not only a rare gas such as argon gas and the like but also a reactive gas such as oxygen-containing gas and the like in case reactive sputtering is performed, shall be understood to be included.

At the bottom of the vacuum chamber 1 there is disposed a stage 2 through an insulating body 11. The stage 2 has a known electrostatic chuck (not illustrated). By charging chuck voltage from a chuck power source to electrodes of the electrostatic chuck, a substrate W is arranged to be held by adsorption on the stage 2 with a film-forming surface facing up.

An opening prepared in an upper wall of the vacuum chamber 1 has disposed therein a cathode unit C. The cathode unit C has: a target 3 having an outline which is slightly larger than the outline of the substrate W; and a magnet unit 4 which is disposed above the target 3 and which relates to this embodiment. The target 3 is placed so as to lie opposite to the stage 2 and further opposite to the substrate W such that the center of the target is positioned on the center line that passes through the center of the substrate W and extends in the vertical direction.

The target 3 is appropriately selected depending on the composition of the thin film to be formed on the surface of the substrate W, and may be constituted by a single metal of Cu, Ti, Co, Ni, Al, W or Ta, or an alloy of two or more kinds of the metals selected from the above, or else may be made of an insulating material of aluminum oxide, magnesium oxide and the like. Then, the target 3 is mounted on an upper wall of the vacuum chamber 1 through an insulating plate 12 in a state of being bonded, through a bonding material such as indium, tin and the like, to a copper backing plate 31 which cools the target 3 at the time of film forming. The target 3 has connected thereto an output from a DC power supply or an AC power supply having a known construction as a sputtering power supply E. It is thus so arranged that, at the time of sputtering, DC power supply or AC power supply having a negative potential (e.g., high-frequency power supply) can be supplied With reference also to FIG. 2, the magnet unit 4 has a yoke 41 made of magnetic material and is to be disposed to lie opposite to the target 3, and a plurality of magnets 42 to be mounted on the lower surface of the yoke 41. A leakage magnetic field in which a line L0 passing through a position where the vertical component of the magnetic field becomes zero is closed in an endless manner, is caused to locally act on such a lower space of the target 3 as is positioned between the center 3c of the target and a periphery 3e thereof. To an upper surface of the yoke 41 there is connected a rotary shaft 43. By rotating this rotary shaft 43 by a motor 5, the yoke 41 and the magnets 42 are arranged to be driven for rotation about the center of the target.

By the way, there is a case in which the circumferential film thickness distribution changes in the outer periphery of the substrate. In such a case, if an adjustment is made of the circumferential film thickness distribution in the outer periphery of the substrate by accelerating or decelerating the magnet unit as in the above-mentioned prior art example, there is a case in which the circumferential film thickness distribution in the inner periphery of the substrate becomes locally deteriorated and, consequently, the film thickness distribution in the in-plane of the substrate may get all the more deteriorated.

Figure 2:
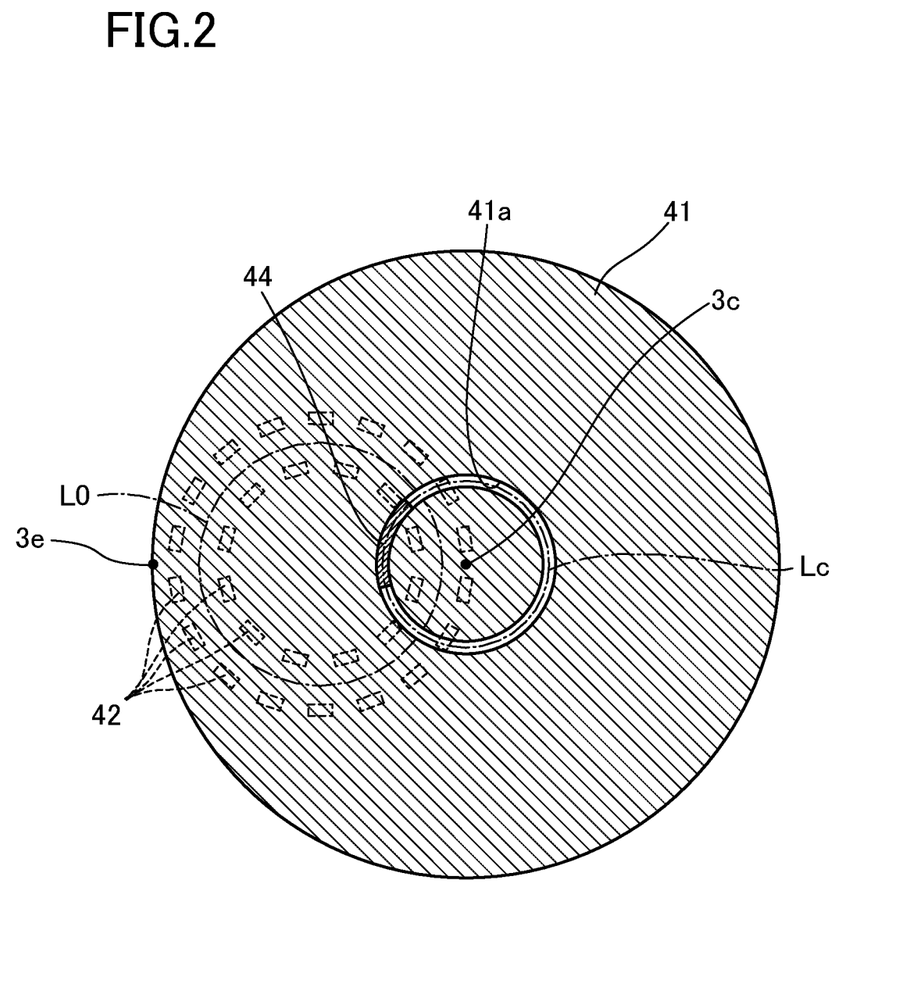
FIG. 2 is a sectional view taken along the line II-II in FIG. 1.

As a solution, in this embodiment there is formed, in a predetermined position of the yoke 41, a recessed groove 41a which circumferentially extends on an imaginary circle LC with the center 3c of the target serving as a center, the recessed groove 41a being recessed downward from an upper surface of the yoke 41. The position in which the recessed groove 41a is formed may appropriately be set considering the sputtering conditions, and the strength and distribution of the leakage magnetic field. Then, with reference to the recessed groove 41a thus formed, there is detachably provided an auxiliary yoke 44. The auxiliary yoke 44 is set shorter than the circumferential length of the recessed groove 41a. To the upper surface of the auxiliary yoke 44 there is connected a lower end of a bar-shaped member 45. A gear 46 provided in meshing with a flanged part 45a that is disposed on an upper end of this bar-shaped member 45 is arranged to be rotatable by a motor 6 as a first driving means. It is thus possible to move the auxiliary yoke 44 along the imaginary circle LC. Further, it is so arranged that, during film formation, the auxiliary yoke 44 is synchronized with the yoke 41 so as to be able to revolve about the center of the target. Still furthermore, the flanged part 45a has connected thereto a piston rod of an air cylinder 7 as a second drive means. It is thus so arranged that the auxiliary yoke 44 can be moved toward or away from the recessed groove 41a (in the vertical direction) relative to the recessed groove 41a. According to this kind of arrangement, for example, by detaching the auxiliary yoke 44 out of engagement with the recessed groove 41a and, after the detached auxiliary yoke 44 is rotated, the auxiliary yoke 44 gets engaged with the recessed groove 41*a*. As a result, the auxiliary yoke 44 can be placed in a desired position of the recessed groove 41*a*.

Further, the rotary shaft 43 and the bar-shaped member 45 have respectively inserted, onto an outside thereof, rotary plates 47*a*, 47*b*. These rotary plates 47*a*, 47*b* have respectively mounted thereon projection pieces 48*a*, 48*b* in a manner to protrude radially outward. In this arrangement, optical sensors 49*a*, 49*b* are respectively disposed so as to correspond to the projection pieces 48*a*, 48*b*. It is thus so arranged that, when the optical sensors 49*a*, 49*b* have detected the projection pieces 48*a*, 48*b*, judgment can be made that the magnet unit 4 is in an origin position. In this case, an arrangement is made to obtain information about the film thickness distribution, to be described hereinafter, by correlating the origin position and the position of a notch on the substrate W.

The above-mentioned sputtering apparatus SM has a control means 8 provided with a known microcomputer, sequencer, and the like so as to make an overall control over the operation of the sputtering power supply E, the operation of the mass-flow controller 10, the operations of the motors 5, 6, the operation of the air cylinder 7, the operation of the vacuum exhausting means P, and the like.

The control means 8 is provided with an information obtaining section 81 and a speed determining section 82. The information obtaining section 81 is constituted to be capable of communication with a film thickness meter disposed, e.g., in an Equipment Front End Module (EFEM) which serves to load and unload the substrate W on and from the sputtering apparatus SM so that the information about the in-plane film thickness distribution of the substrate as measured by the film thickness meter can be obtained. The speed determining section 82 determines the acceleration amount and deceleration amount from the reference speed of the magnet unit 4 based on the obtained information. Then, the motors 5, 6 are driven at the determined speed so that the yoke 41 and the auxiliary yoke 44 of the magnet unit 4 can be rotated in synchronization with each other.

By the way, as to the film thickness meter, one having a known construction can be used. For example, in case a metal film of low resistance value is formed at a relatively larger film thickness, a film thickness meter of an eddy-current type may be used. Further, in case an insulating film is formed at a relatively smaller film thickness, a spectroscopic ellipsometer may be used. As another film thickness meter, there may be used a laser displacement meter. A description will hereinafter be made of a film forming method for forming an aluminum film on a surface of a substrate W.

First, by the vacuum exhausting means P, the vacuum chamber 1 is evacuated inside thereof down to a predetermined pressure (e.g., $1\times10^{-5}$ Pa). By means of a transfer robot (not illustrated) a substrate W is transferred into the vacuum chamber 1, and the substrate W is handed over to the stage 2. Then, voltage is applied to the electrodes of the chuck plate of the stage 2, thereby holding by adsorption the substrate W. Subsequently, by means of the mass flow controller 10, argon gas as a sputtering gas is introduced in a predetermined amount (e.g., 12 sccm) (the pressure at this time is 0.1 Pa). By charging an aluminum target 3, e.g., with DC power of 30 kW from the sputtering power supply E, a plasma atmosphere is formed inside the vacuum chamber 1. At this time, the auxiliary yoke 44 is kept out of engagement with the recessed groove 41*a*. Then, the magnet unit 4 is rotated from the origin position where the optical sensor 49*a* detected the projection pieces 48*a* at least one cycle (1 rotation) at a predetermined reference speed (e.g., 40 rpm) about the target. According to these operations, the target 3 gets sputtered, and the sputtered particles scattered from the target 3 will get adhered to, and deposited on, the surface of the substrate W, thereby forming an aluminum film. The substrate W on which a film has been formed is taken out of the vacuum chamber 1 and measurements are made by a film thickness meter (not illustrated) of the film thicknesses of the aluminum film at a plurality of in-plane spots of the substrate W, thereby obtaining information about the in-plane film thickness distribution of the substrate. The obtained information is transmitted to the information obtaining section 81 of the control means 8, and the information obtaining section 81 obtains the information in question (information obtaining step).

Then, based on such information about the film thickness distribution as was obtained in the information obtaining step, the speed of the magnet unit 4 is determined (speed determining step). In this speed determining step, an orbit (circle) of the magnet unit 4 in one cycle is circumferentially and evenly segmented (e.g., the rotational movement of 360° is segmented into 24 segments of every 15°). Each of the segments is respectively defined as a zone, and the position of the origin is defined as a reference zone. Then, the speed at this reference zone is defined as a reference speed and, for each of the zones other than the reference zone, an amount of acceleration or an amount of deceleration from the reference speed is determined. It is to be noted here that, in a zone where the film thickness is smaller than that in the reference zone, deceleration is made by a predetermined value from the reference speed so as to increase the amount in which the target 3 gets sputtered (sputter rate). On the other hand, in a zone where the film thickness is larger than that in the reference zone, acceleration is made by a predetermined value from the reference speed so as to decrease the sputter rate, whereby the circumferential film thickness distribution in the outer periphery of the substrate is adjusted (film thickness distribution adjustment step).

Thereafter, based on the above-mentioned obtained information, in the inner periphery of the substrate in which the recessed groove 41*a* is formed, the auxiliary yoke 44 is caused to get engaged with the portion where the film thickness is locally small. As a result of an increase in the magnetic field strength in the portion in question, the sputter rate can be increased. It is thus possible to re-adjust the film thickness in the spot in which the film thickness varied in the inner periphery of the substrate (re-adjusting step).

After having re-adjusted the film thickness in the above-mentioned re-adjusting step, the substrate W is transferred into the vacuum chamber 1 and is held by adsorption onto the stage 2. While driving to rotate the magnet unit 4 at the determined speed, an aluminum film is formed on the surface of the substrate W (film forming step) on similar conditions as above. At this time, the auxiliary yoke 44 is rotated in synchronization with the yoke 41.

According to the above arrangement, based on the information obtained in the information obtaining step, the auxiliary yoke 44 is engaged with the recessed groove 41*a* that is formed in the yoke 41, or the auxiliary yoke 44 is released out of engagement with the recessed groove 41*a*. Then, in the region in which the recessed groove 41*a* is formed, the magnetic field strength is locally increased or decreased. Therefore, by adjusting the circumferential film thickness distribution in the outer periphery of the substrate as mentioned above, in case the film thickness in the inner periphery on the inner side than the above has become locally smaller, the auxiliary yoke 44 may be engaged with the recessed groove 41a that is formed in the inner periphery of the substrate. Then, the magnetic field strength increases so that the sputter rate in the region in question can be increased. As a result, the film thickness in a spot in which the film thickness has changed can be re-adjusted, and a more uniform film thickness distribution can be obtained over the entire surface thereof.

Next, experiments were carried out by using the above-mentioned sputtering apparatus SM in order to confirm the effect of this invention. The substrate W was made to be a silicon wafer of Φ300 mm (in diameter). Argon gas was introduced into the vacuum chamber 1 in an amount of 12 sccm (the pressure at this time was 0.1 Pa), and DC power of 30 kW was applied to the aluminum target 3 to thereby generate a plasma atmosphere. While rotating the magnet unit 4 at constant speed of 40 rpm, the target 3 got sputtered to thereby form an aluminum film on the surface of the substrate W. At this time, the auxiliary yoke 44 remained disengaged with the recessed groove 41a. By measuring the film thickness of the aluminum film, with a film thickness meter, at a plurality of in-plane spots of the substrate W, the information about the in-plane film thickness distribution of the substrate was obtained. According to this operation, the maximum value of the circumferential film thickness in the outer periphery of the substrate (an imaginary circle of 147 mm in radius) was 40.79 nm, the minimum value was 38.90 nm, and the difference (hereinafter called "range") between the maximum value and the minimum value was 1.89 nm. On the other hand, the maximum value of the circumferential film thickness in the inner periphery (an imaginary circle of 98 mm in radius) was 40.65 nm, the minimum value was 39.10 nm, and the range was 1.55 nm. When the speed of the magnet unit 4 was determined for each of the 24-piece zones based on the film thickness distribution in the outer periphery of the substrate, and then the circumferential film thickness distribution in the outer periphery of the substrate was adjusted, the maximum value of the circumferential film thickness in the outer periphery of the substrate was 40.96 nm, the minimum value was 39.73 nm, and the range was as small as 1.23 nm, but the maximum value of the circumferential film thickness in the inner periphery of the substrate was 42.56 nm, the minimum value was 39.73 nm, and the range was worsened to 2.83 nm. As a solution, the auxiliary yoke 44 was brought into engagement with the recessed groove 41a in a portion where the film thickness in the inner periphery of the substrate was the minimum value so as to re-adjust the film thickness distribution in the inner periphery of the substrate. Then, the maximum value was 40.02 nm, the minimum value was 39.66 nm, and the range became as small as 0.36 nm. In this manner, by adjusting the circumferential film thickness distribution in the outer periphery of the substrate, even in case the film thickness in the inner periphery of the substrate became locally smaller, it has been confirmed that: by engaging the auxiliary yoke 44 with the recessed groove 41a formed in the inner periphery of the substrate, the magnetic field strength increases and the sputter rate in the region in question can be increased; and that the film thickness in the spot where the film thickness changed can be re-adjusted.

A description has so far been made of the embodiment of this invention, but this invention shall not be limited to the above. In the above-mentioned embodiment, a description was made of an example in which the auxiliary yoke 44 is automatically engaged with the recessed groove 41a, but the engagement may be made manually. In this case, too, the auxiliary yoke 44 may be rotated in synchronization with the yoke 41.

Figure 3:
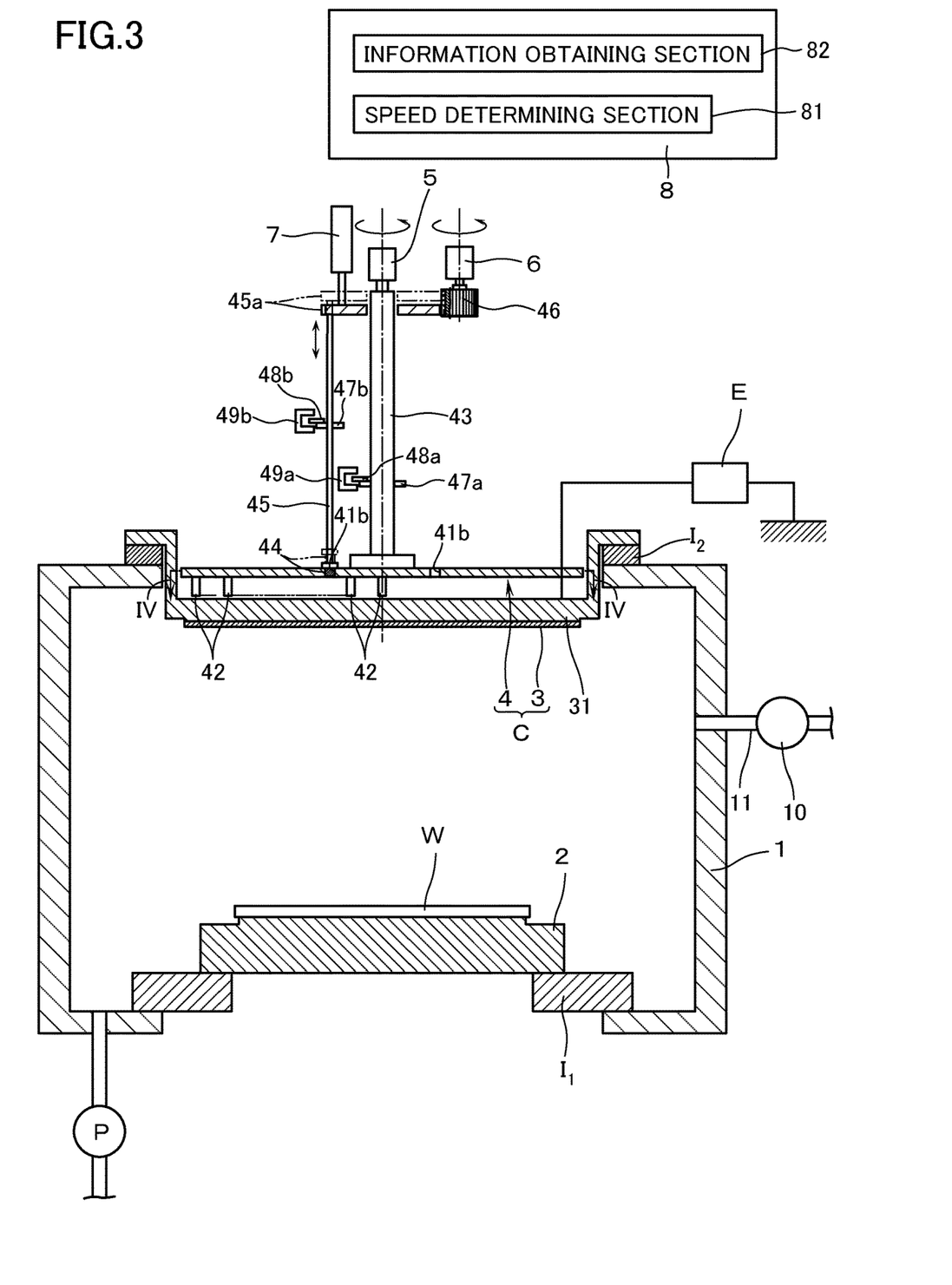
FIG. 3 is a schematic view to explain the construction of a sputtering apparatus to which is applied a magnet unit for magnetron sputtering apparatus relating to a modified example of this invention.
Figure 4:
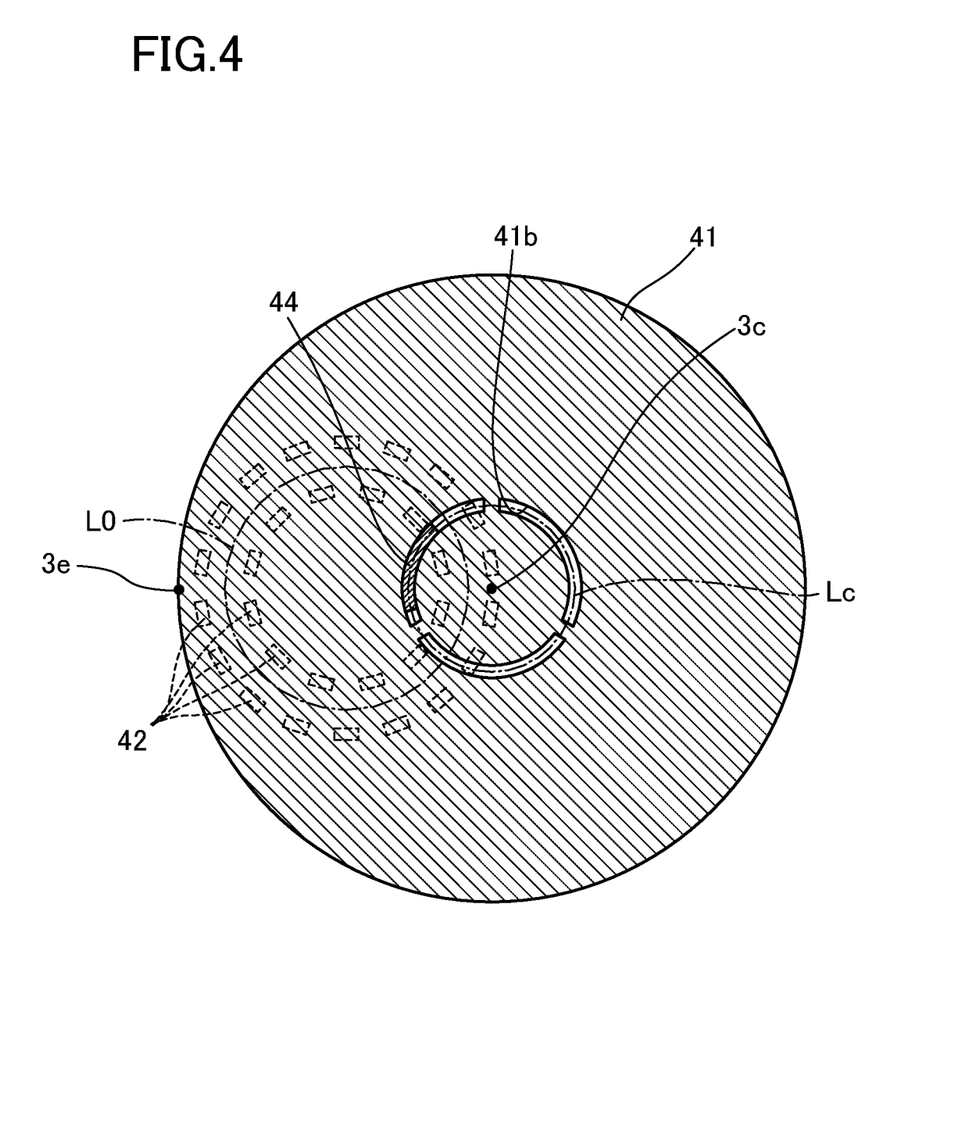
FIG. 4 is a sectional view taken along the line IV-IV in FIG. 3.

In the above-mentioned embodiment, a description was made of an example in which the recessed groove 41a was formed so as to be recessed downward from the upper surface of the yoke 41. Alternatively, as shown in FIG. 3 and FIG. 4, the recessed groove 41b may be formed in a manner to penetrate through the yoke 41.

In the above-mentioned embodiment, a description was made of an example in which the speed of the magnet unit 4 is determined based on the film thickness. However, the speed of the magnet unit 4 may also be determined based on the information having correlation with the film thickness. For example, measurement is made of a target voltage to be charged to the target 3 for each of the zones when a certain charge voltage is applied to the target 3 and then, based on the measured target voltage, the speed of the magnet unit 4 may be determined. In this case, an arrangement may be made such: that the target voltage corresponding to each of the zones is obtained; that an average value (average voltage) of the target voltages in all of the zones inclusive of the reference zone is obtained; and that a ratio of the target voltage correlated with each of the zones, to the average voltage is obtained. An amount of acceleration or an amount of deceleration from the reference speed may be determined such: that the speed of the magnet unit 4 becomes lower in a zone of high ratio; and that the speed of the magnet unit 4 becomes higher in a zone of low obtained ratio.

Figure 5:
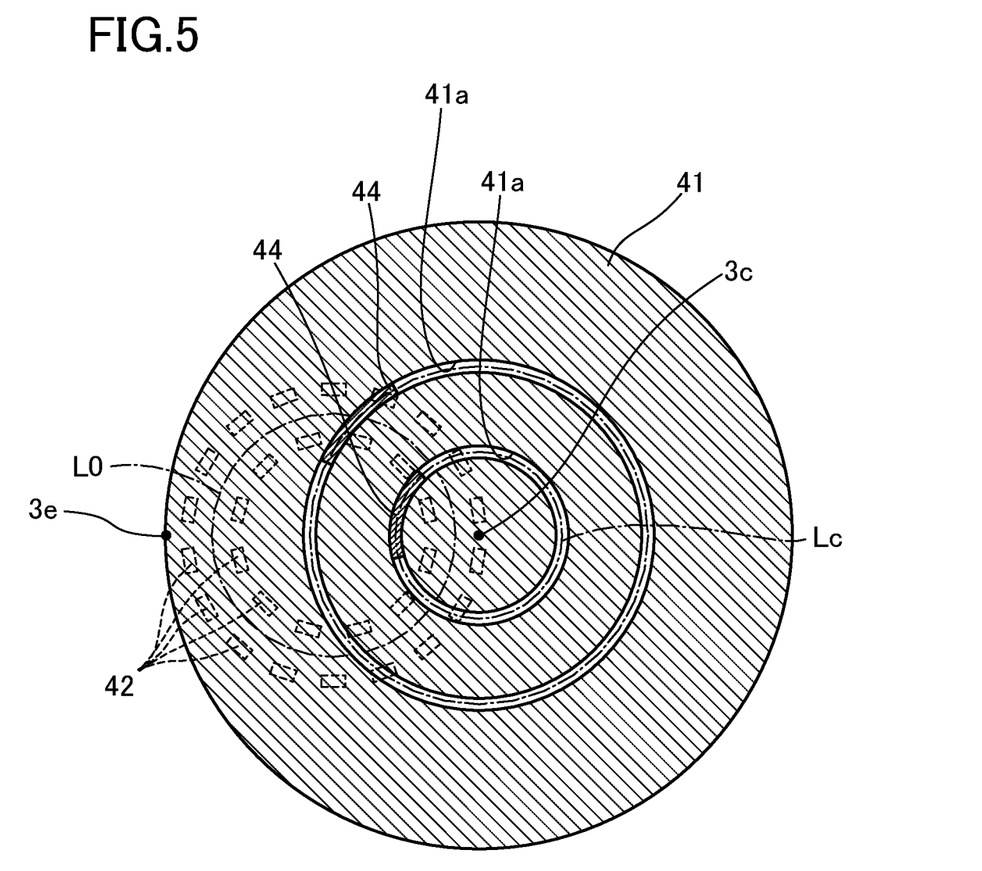
FIG. 5 is a sectional view showing an essential part of the magnet unit relating to a modified example of this invention.

Further, in the above embodiment, a description was made of an example in which the target 3 was a circle as seen in plan view (i.e., as seen from the top), and in which the magnet unit 4 was driven for rotation. This invention is, however, applicable also to a case in which the magnet unit is moved in parallel with each other in one of the X-axis direction and the Y-axis direction, where the target is defined to be rectangular as seen in plan view, and where the directions along the sputtering surface are defined to be X-axis direction and Y-axis direction, respectively. Still furthermore, as shown in FIG. 5, the recessed groove 41a may be disposed in a plurality of sets (2 sets in the example shown in FIG. 5) in the radial direction. According to this arrangement, since it becomes possible to re-adjust the film thickness for each of the places in which the recessed groove 41a is disposed, still better film thickness distribution can be obtained.

Figure 6:
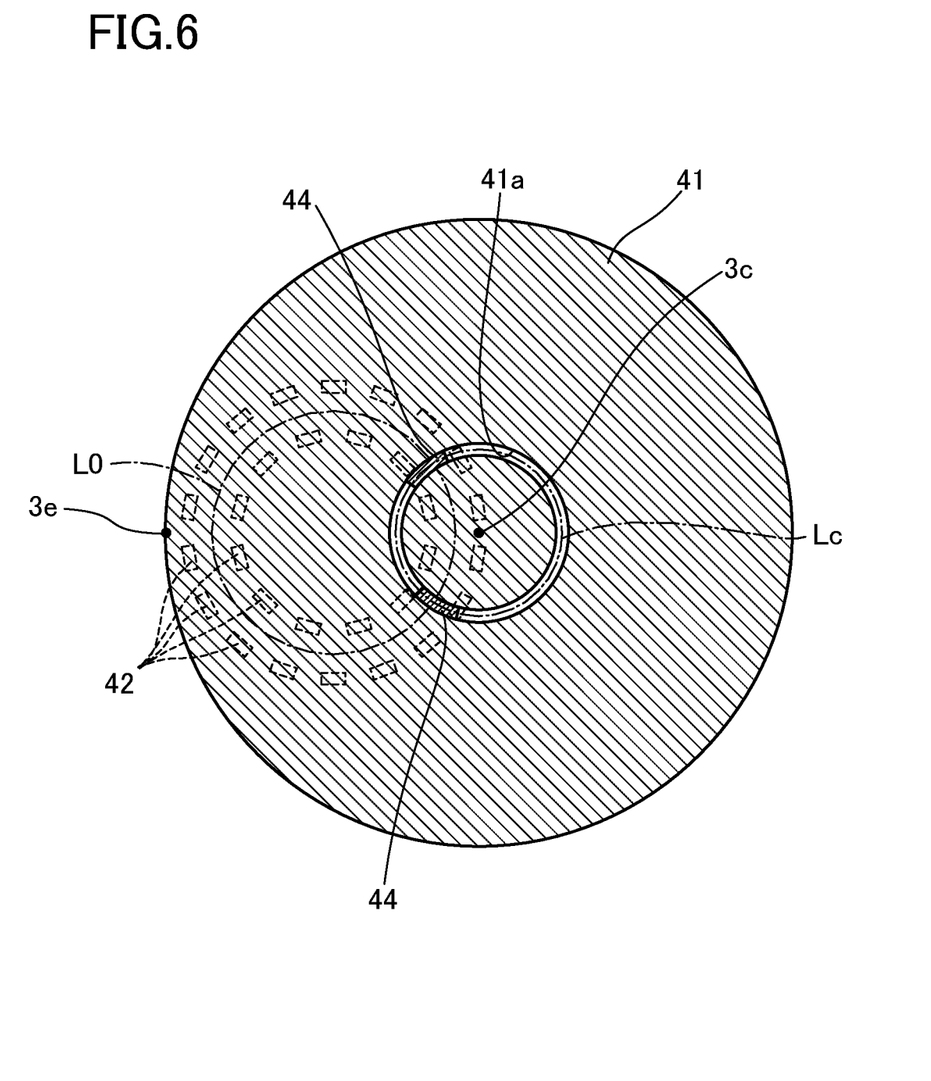
FIG. 6 is a sectional view showing an essential part of the magnet unit relating to a modified example of this invention.

Further, in the above-mentioned embodiment, a description was made of an example in which one auxiliary yoke 44 is disposed but, as shown in FIG. 6, the auxiliary yoke 44 may be divided into a plurality of pieces so that a plurality of auxiliary yokes 44 may be arranged to be movable individually. According to this arrangement, it becomes possible to individually operate the plurality of auxiliary yokes 44 to thereby appropriately adjust the magnetic field coupling. As a consequence, a still better film thickness distribution can be obtained.

DESCRIPTION OF REFERENCE MARKS

| 3  | target  | 4        | magnet unit     |
|----|---------|----------|-----------------|
| 41 | yoke    | 41a, 41b | recessed groove |
| 42 | magnet  | 44       | auxiliary yoke  |

The invention claimed is:
1. A magnet unit for a magnetron sputtering apparatus, the magnet unit being disposed above a target, provided that a side of the target that gets sputtered is defined to be a sputtering surface and that a sputtering surface side of the target is defined to be lower,     the magnet unit comprising: a yoke made of magnetic material and disposed so as to lie opposite to the target; and a plurality of magnets disposed on a lower surface of the yoke, wherein a leakage magnetic field in which a line passing through a position where the vertical component of the leakage magnetic field becomes zero is closed in an endless manner, is caused to locally act on a lower space of the target, the lower space being positioned between a center of the target and a periphery thereof, the magnet unit being driven for rotation about the center of the target,     wherein the yoke has: in a predetermined position thereof a recessed groove formed in a circumferentially elongated manner along an imaginary circle in a manner to be recessed from an upper surface of the yoke downward or penetrating the yoke; and an auxiliary yoke disposed in a manner to be freely engaged with, or released out of engagement with, the recessed groove.

2. The magnet unit for a magnetron sputtering apparatus according to claim 1, wherein the auxiliary yoke is set shorter than a circumferential length of the recessed groove, the magnet unit further comprising a first drive means for moving the auxiliary yoke along the imaginary circle.

3. The magnet unit for a magnetron sputtering apparatus according to claim 1, further comprising a second drive means for moving the auxiliary yoke in a direction toward or away from the recessed groove.

4. The magnet unit for a magnetron sputtering apparatus according to claim 2, further comprising a second drive means for moving the auxiliary yoke in a direction toward or away from the recessed groove.

\* \* \* \* \*